United States Patent [19]

Kosmowski

[11] Patent Number: 5,068,958
[45] Date of Patent: Dec. 3, 1991

[54] METHOD AND APPARATUS FOR CHANGING TOOLS IN AN AUTOMATED MACHINE TOOL

[75] Inventor: Wojciech Kosmowski, San Juan Capistrano, Calif.

[73] Assignee: Dynamotion Corporation, Santa Ana, Calif.

[21] Appl. No.: 584,807

[22] Filed: Sep. 18, 1990

[51] Int. Cl.⁵ .................................... B23Q 3/157
[52] U.S. Cl. ................... 29/568; 364/474.21
[58] Field of Search ............. 29/568, 26 A; 408/1, 408/35; 364/474.21; 414/730

[56] References Cited

U.S. PATENT DOCUMENTS

| 3,114,964 | 12/1963 | Bramson | 29/212 |
|---|---|---|---|
| 3,188,736 | 6/1965 | Brainard et al. | 29/568 |
| 3,288,032 | 11/1966 | Pankonin et al. | 90/11 |
| 3,554,617 | 1/1971 | Weaver | 308/3 |
| 3,973,863 | 8/1976 | Smith | 408/241 R |
| 4,000,954 | 1/1977 | Pateel | 408/3 |
| 4,088,417 | 5/1978 | Kosmowski | 408/1 BD |
| 4,419,807 | 12/1983 | Moulin | 29/568 |
| 4,486,928 | 12/1984 | Tucker et al. | 29/774 A |
| 4,520,551 | 6/1985 | Imhof | 29/568 |
| 4,654,954 | 4/1987 | Bayes et al. | 29/568 |
| 4,656,727 | 4/1987 | Itoh | 29/568 |
| 4,658,494 | 4/1987 | Ohtani et al. | 29/568 |
| 4,715,108 | 12/1987 | Sugiyama et al. | 29/568 |
| 4,761,876 | 8/1988 | Kosmowski | 29/568 |
| 4,922,603 | 5/1990 | Kosmowski | 29/568 |
| 4,928,381 | 5/1990 | Yaguchi et al. | 408/35 X |

FOREIGN PATENT DOCUMENTS

| 0028735 | 5/1981 | European Pat. Off. . |  |
|---|---|---|---|
| 0060638 | 9/1982 | European Pat. Off. . |  |
| 1808705 | 7/1969 | Fed. Rep. of Germany . |  |
| 1477478 | 8/1969 | Fed. Rep. of Germany . |  |
| 1920275 | 2/1970 | Fed. Rep. of Germany . |  |
| 1389246 | 1/1965 | France . |  |
| 2382828 | 11/1978 | France . |  |
| 0132875 | 11/1978 | Japan . |  |
| 0157413 | 12/1980 | Japan . |  |
| 0082146 | 7/1981 | Japan . |  |
| 5695560 | 8/1981 | Japan . |  |
| 0094951 | 6/1983 | Japan . |  |
| 168441 | 7/1986 | Japan | 29/568 |
| 289508 | 8/1970 | Netherlands . |  |
| 1077752 | 3/1984 | U.S.S.R. . |  |
| 1139610 | 2/1985 | U.S.S.R. | 29/568 |
| 1202361 | 8/1970 | United Kingdom . |  |
| 1215917 | 12/1970 | United Kingdom . |  |
| 1229161 | 4/1971 | United Kingdom . |  |
| 1234936 | 6/1971 | United Kingdom . |  |
| 1249296 | 10/1971 | United Kingdom . |  |
| 1408131 | 10/1975 | United Kingdom . |  |
| 2014882 | 9/1979 | United Kingdom . |  |
| 2021448 | 12/1979 | United Kingdom . |  |

*Primary Examiner*—William Briggs
*Attorney, Agent, or Firm*—Roberts and Quiogue

[57] ABSTRACT

An automated tool changer system for a drilling or other type of machine tool system. A gripper apparatus transports tools held in a tool magazine to a tool working unit such as a drill spindle. The tool working unit is supported by an upper support beam above a workpiece-supporting table mounted for movement in an X-Y plane. The magazine is supported by a sliding carriage mounted on the upper support beam, and can be moved upwardly and downwardly to insert and remove tools from the gripper apparatus. The gripper apparatus is supported by the X-Y table, and can be raised or lowered relative to the table during the tool changing operation. The gripper apparatus is provided with two possible grip pressures, and with a sensor for detecting the presence of the tool end at a predetermined grip jaw reference point. The sensor permits the tool to be inserted into the spindle chuck with a predetermined length of tool extending from the chuck.

25 Claims, 8 Drawing Sheets

METHOD AND APPARATUS FOR CHANGING TOOLS IN AN AUTOMATED MACHINE TOOL

BACKGROUND OF THE INVENTION

The present invention relates to high speed automated machines for performing machine operations on a workpiece, and more particularly to tool changer systems for such automated machines.

A preferred application to which the invention relates is that of printed circuit board drilling. Printed circuit boards are in universal use today to mount and interconnect electrical components forming electrical circuitry. Typically the leads of the components are inserted through holes drilled in the boards to form predetermined hole patterns. Various systems are known in the art for automated drilling of the holes in printed circuit boards. One such system is described in U.S. Pat. No. 4,761,876. The system described therein is particularly well suited to drilling very small diameter holes, and describes a tool changer which employs a plurality of tool magazines and clips to hold the tools with the tools being secured or released by a top plate which captures the tools in a shank groove of reduced cross-sectional dimension. The groove is formed in either the shank or in a tool collar which is fitted on the shank.

The tool changer system of the '876 patent works well. the use of tools with the groove formed directly in the shank works particularly well, since for high speed operation, the tool is well balanced. The use of a collar can lead to balance problems at very high speeds of operation, unless care is taken in the fabrication and fitting of the collar to the drilling tool. However, a disadvantage of the tool changer system of the '876 patent is the additional cost of either forming the groove in the shank or providing the collar. For example the cost of machining the groove on the shank of a drilling tool can add as much as $.50 to the cost of each tool, while a plastic collar can add $.10 to cost of the tool. A given drilling system with multiple spindles such as the system described in the '876 patent which undergoes heavy use can use hundreds of thousands of drilling tools in a single year of operation. The added cost of machining the grooves in the tool shanks or fabricating and fitting the plastic collars to the tool can add tens of thousands of dollars to the operating cost of a single multiple spindle drilling system. This is so even if the drills are sharpened and reused several times.

The use of sharpened tools leads to another problem. Whereas new tools have a given or known nominal length, tools lose some of their length as a result of being sharpened. It is desirable to have a known length of tool extending from the drilling spindle during the drilling operation, so that the length of the drilling stroke does not carry the tool tip too far, or fail to extend the drill tip completely through the workpiece or as far as desired. In the past, some systems have relied on the placement of the collar to register the insertion position of the drill in the spindle. The use of such collars leads to cost and balance disadvantages as described above.

It is therefore an object of the present invention to provide a method and apparatus which can reliably change tools used in an automated machine tool without requiring the tools to be modified, and which can insert tools of various lengths in the working unit with a given length of tool extending therefrom.

SUMMARY OF THE INVENTION

A method and corresponding apparatus is disclosed for inserting a first end of an elongated tool of unknown length into a working unit so that a predetermined length of the tool extends from the unit. The method comprises a sequence of the following steps.

(i) Gripping the tool in a gripper device with a relatively high gripping pressure so that the first end of the tool extends from the gripper device, with a length of the tool received within the gripper device which is less than the predetermined length.

(ii) Aligning the gripper device with the working unit.

(iii) Effecting relative movement between the gripper device and the working unit to insert the first end of the tool into the working unit.

(iv) Gripping the tool by the working unit and reducing the gripping pressure of the gripper device on the tool so that further relative movement of the gripper and the working unit causes sliding movement of the tool in the gripper device.

(v) Effecting further relative movement between the gripper device and the working unit to reduce the distance therebetween while causing the tool to slide further within the gripper device until the length of the tool received within the gripper device is substantially equal to said predetermined length.

(vi) Releasing the tool gripping by the working unit and increasing the gripping pressure of the gripper device.

(vii) Effecting further relative movement between the gripper device and the working unit to bring the gripper device and the working unit substantially adjacent each other to insert said tool into said working unit with said predetermined length extending from the working unit.

In a preferred apparatus, the gripper device comprises a plurality of grip jaws each characterized by a jaw tip, and means for closing said jaws to exert gripping force on a tool inserted therebetween. The closing means comprising means for selectively applying a relatively high gripping force and a relatively low gripping force.

The gripper device further includes means for translating the gripper jaws along a predetermined axis between a first position and a second position, and sensor means for sensing the condition that a tool has been inserted into the grip of the jaws a predetermined distance from the jaw tips. The sensor signal is employed in the insertion method.

A preferred application for the invention is as a tool changer system for a machine tool characterized by at least one spindle driving a replaceable tool having a shank and a tool end, a workpiece carrier mounted for movement in a plane, the spindle being translatable to effect movement of the tool relative to the workpiece carrier. The tool changer system comprises a tool magazine for releasably holding a plurality of said tools, the magazine comprising means for effecting translating movement of said magazine relative to the workpiece carrier.

The system further includes a gripper apparatus secured to the workpiece carrier and comprising gripper means for receiving said tools in an inserted position within a tool gripper and selectively gripping said tools with a selectable grip pressure of either a relatively high grip pressure or a relatively low grip pressure to transfer tools between the spindle and the magazine, and means for effecting translating movement of the gripper means relative to the workpiece carrier. Means are provided for sensing when the tool has been inserted to a predetermined depth in the tool gripper and generating an insertion depth signal indicative of such condition.

The system further includes a controller for inserting the tool into the spindle so that a predetermined length of tool extends from the spindle. The controller comprising means for aligning the gripper apparatus with a selected one of the tools in the magazine, and causing translation between the gripper and the magazine to insert the tool into the gripper means so that the length of tool inserted into the gripper means is less than said predetermined length, gripping the tool with the relatively high gripping pressure, thereafter aligning the gripper apparatus with the spindle, translating the gripper means in relation to the workpiece carrier to insert a portion of the exposed tool into the spindle, causing the spindle to securely grip the inserted portion of the tool, reducing the grip pressure of the gripper device, translating the spindle relative to the gripper device to insert more of the tool into the gripper until the insertion depth signal is generated, increasing the gripper device grip pressure and releasing the tool grip by the spindle; and translating the spindle toward the gripper device until the spindle is directly adjacent the gripper device so that said predetermined length of tool extends from the spindle; and releasing the gripping pressure of the gripper apparatus and causing the spindle to grip the tool in its inserted position.

BRIEF DESCRIPTION OF THE DRAWINGS

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

Figure 1:
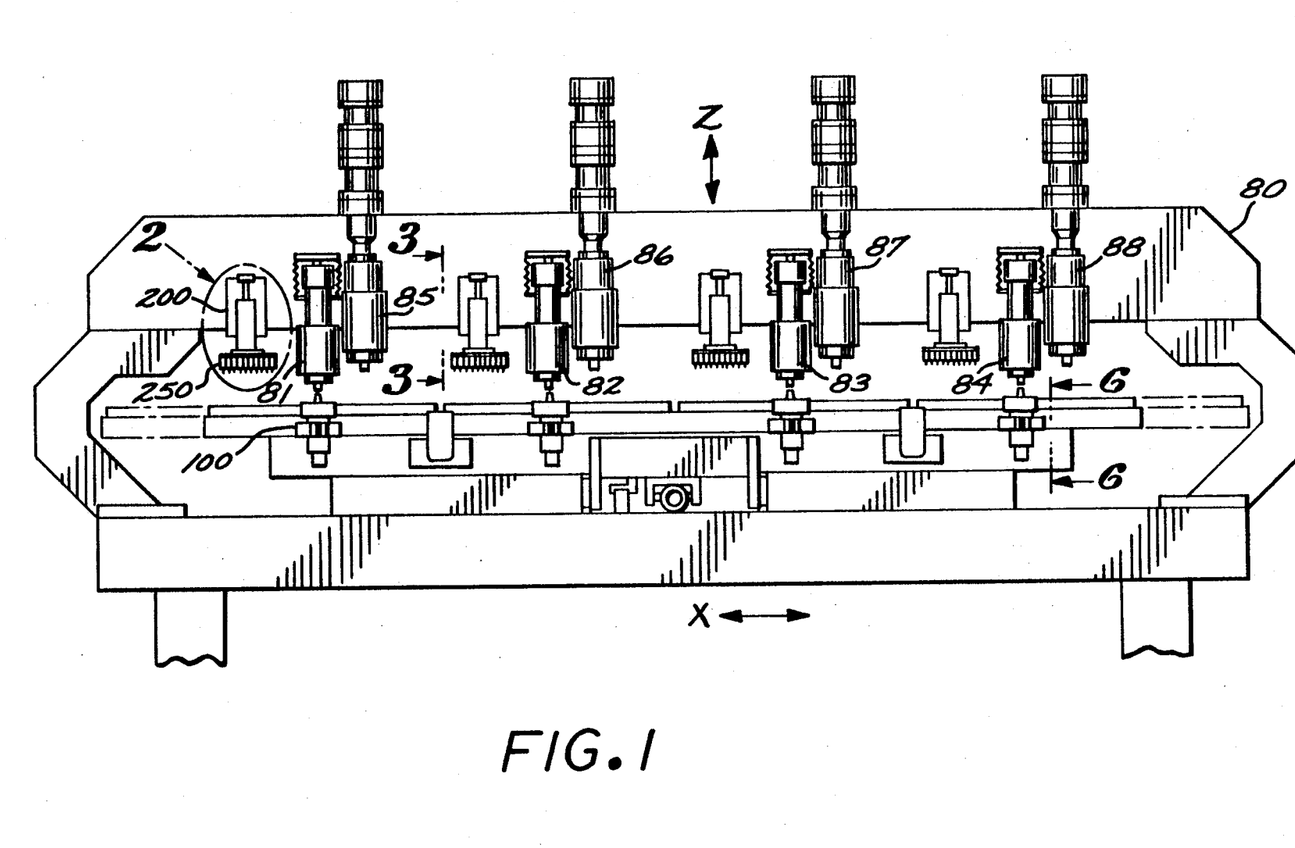
FIG. 1 is a front elevation view of an automated drilling machine employing the tool changer system of the present invention.

Referring now to FIG. 1, a front elevation view is shown of the general configuration of a high speed drilling system 50 employing a tool changing system in accordance with the present invention. In general, the drilling system 50 is as described in U S. Pat. No. 4,761,876, incorporated herein by this reference, with the exception of the tool changer system. While the invention is described with respect to drilling systems, it will be appreciated that the invention may be used advantageously with other types of automated machines employing a plurality of tools, such as milling and routing machines, for example.

As described in U.S. Pat. '876, the system 50 is a multiple spindle system, having four pairs of spindles; one spindle of each pair is adapted for drilling of medium to large diameter holes in workpieces, and the second spindle of the pair is adapted for high speed drilling of small diameter holes. The spindles 85-88 of the former group have pneumatically operated chucks which are opened and closed to grip a drill bit by air pressure, while the spindles 81-84 of the latter group have centrifugally operated chucks which statically grip the tool shanks by friction.

The spindles 81-88 are mounted on a top support beam 80 for translation upwardly and downwardly in the Z axis directions. A work piece carrier or supporting table 70 is supported below the top beam 80 for movement in the X-Y plane. The support for the table 70 and the means for moving the table in the X-Y plane are described in U.S. Pat. No. 4,761,876.

In accordance with the invention, a plurality of tool gripper apparatus 100 are mounted along the forward edge of the X-Y table 70, one gripper apparatus 70 for each pair of spindles. A plurality of tool magazines 200, each for holding a plurality of removable tool clips 250, is mounted adjacent the respective spindles on the top support beam 80 for translation in the Z direction. As will be described in more detail below, the gripper apparatus 100 provides a means to transport a selected tool from the tool magazines 200 to the corresponding spindle chuck, and vice versa, i.e., to load and unload the spindles with selected tools.

The magazine assembly 200 is shown in more detail in FIGS. 2-5. The assembly 200 includes a magazine housing 210 which defines a plurality of longitudinal magazine slots 212. The slots 212 accept respective tool clips 250 which hold the individual tools 280. The clips 250 are releasably locked into the respective slots 212 by a spring-loaded lever 214, with end 215 of the lever urged into contact with the shoulder 252 formed at a corner of the clip 250. Thus, the respective clips can be loaded into the magazine, and are locked in place by action of the lever 214. To remove a clip 250, the lever tip 216 is pressed down, releasing the clip and permitting it to be slid out of the slot 212.

The magazine assembly 200 further comprises a means for raising and lowering the magazine housing 210 along the Z axis. The housing 210 is mounted on a slide member 220 which is bearing mounted with respect to a corresponding V-block member 224 secured to the upper support beam 80. The slide member 220 and V-block member 224 are shown in further detail in FIGS. 3 and 5, and comprise a commercially available cross roller slide assembly. A suitable assembly is available from Daedal, Box 500, Harrison City, Penna. 15636, as the model CR4601.

Figure 2:
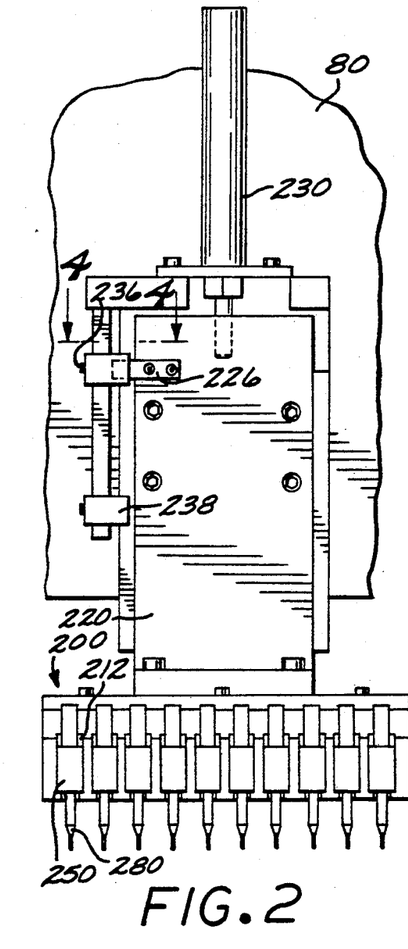
FIGS. 2-5 illustrate the tool magazine fixture employed in the tool changer system.
Figure 3:
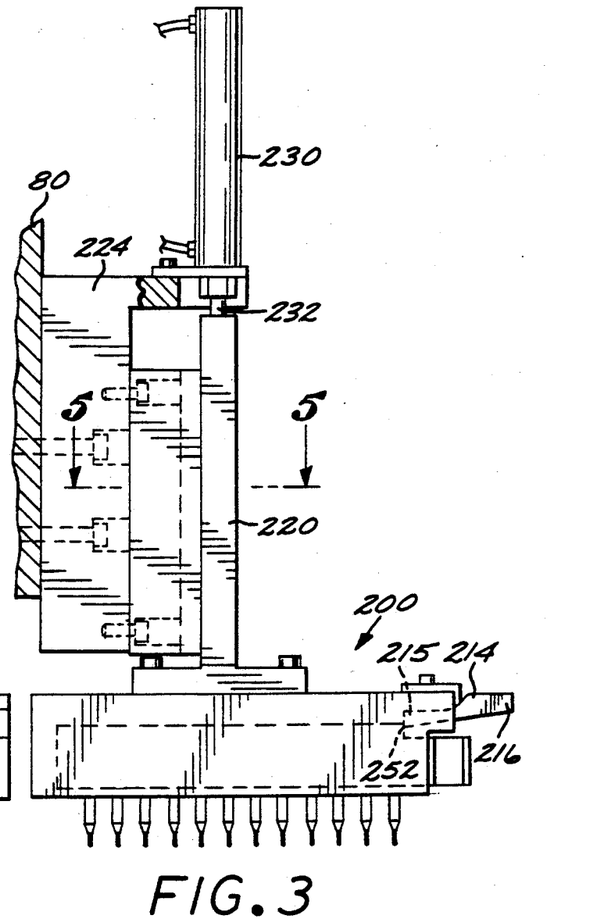
Figures 4, 5:
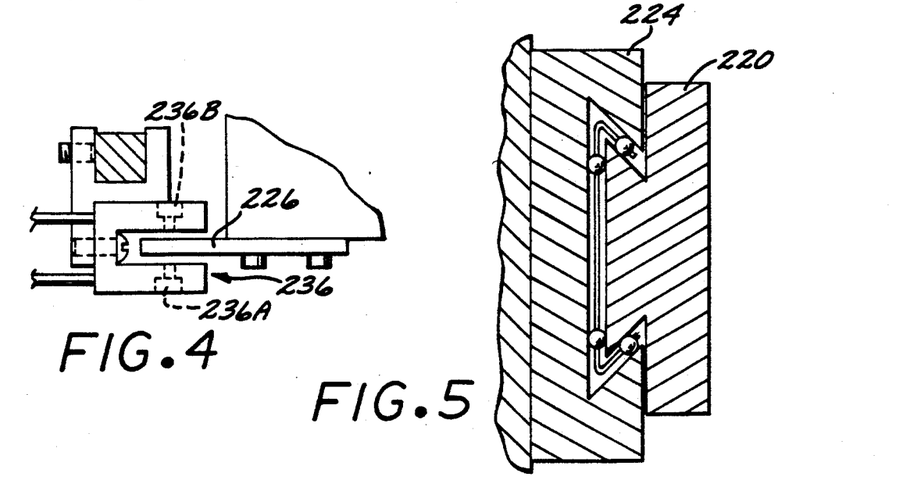

An air cylinder 230 is mounted to the stationary member 224, with the end of its piston secured to the movable slide member 220. The cylinder 230 is a double-acting cylinder, and may be actuated to either extend or retract the piston 232. In the retracted position, the magazine housing is raised to its uppermost position relative to the X-Y table 70. In the extended position the housing is lowered to its lowermost position.

Upper and lower optical sensors 236 and 238 sense the presence of pin 226 which extends from the side of the slide member 220 to provide sensor indication signals to the controller of the tool changer system (FIG. 15) that the magazine assembly 200 is at either the upper position or the lower position. The sensors 236 and 238 employ light sources which direct a light beam across a slot through which the pin 226 passes in its travel. A photosensitive detector comprising the sensor detects the interruption of the light beam when the pin passes through the sensor slot. Thus, in FIG. 4, element 236A represents the light source, and element 236B represents the detector. Such sensors are commercially available, and well known to those skilled in the art.

Figures 6, 7:
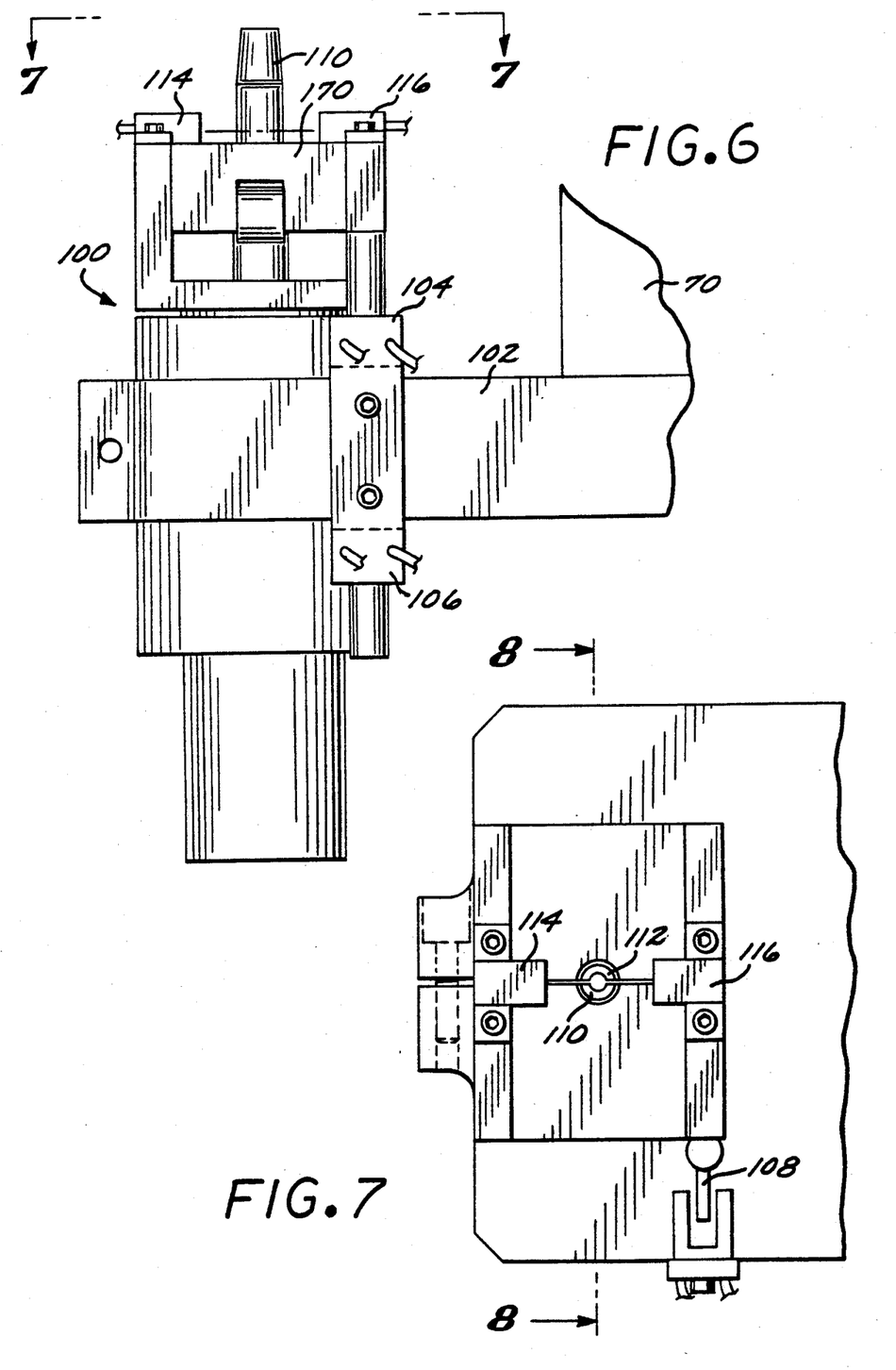
FIGS. 6-9 illustrate the tool gripper comprising the tool changer system.

An exemplary gripper apparatus 100 is illustrated in further detail in FIGS. 6-9. The apparatus is secured to the forward edge of the X-Y table 70 as generally indicated in FIG. 7 by a support bracket 102. Generally the gripper apparatus includes a pair of gripper jaws which may be opened and closed, and a means for raising and lowering the jaws along the Z axis.

Figure 8:
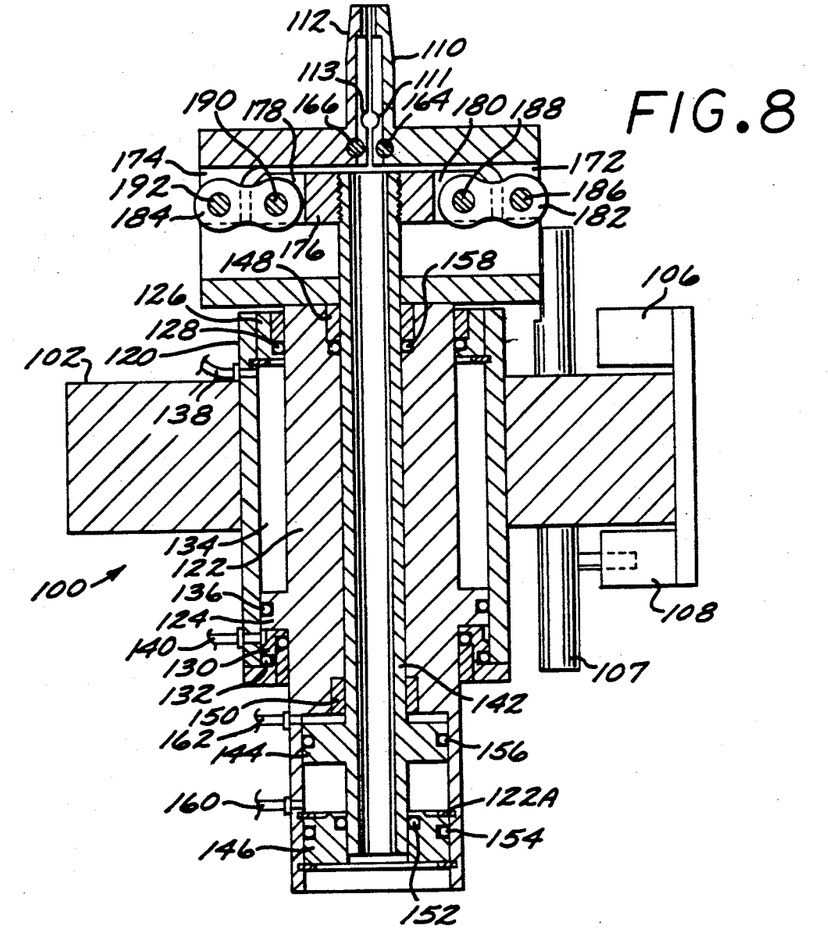

The gripper 100 further comprises a pair of optical sensors 104 and 106 appropriately positioned above and below the bracket 102 to sense the presence of pin 108 protruding from the side of a rod 107 carried by the gripper jaw assembly, as shown in FIG. 8. The sensors 104 and 106 operated in a manner similar to the sensors 236 and 238 described with respect to the tool magazine apparatus, and to sense the positioning of the gripper apparatus at its upper and lower positions relative to the X-Y table.

FIG. 8 illustrates the gripper apparatus 100 in longitudinal cross-section. The outer housing 120 serves as the cylinder for the Z axis pneumatic cylinder actuator which moves the gripper apparatus upwardly and downwardly along the Z axis. A hollow cylindrical member 122 serves as the piston for the Z axis drive actuator. The member 122 further defines a region 124 of increased cross-sectional diameter.

The cylinder defining housing 120 is provided with sealing structures 126 and 130 at each end thereof and with O-ring seals 128 and 132, to provide a seal against the pressure of the air (or other fluid) used to pressurize the cylinder chamber 134. An O-ring seal 138 seals between the edge of the region 124 and the inner surface of the housing 120. By admitting pressurized air either through the air line 138 or through air line 140, force is exerted against the annular region of the piston 122 to either move the piston 122 upwardly or downwardly.

The piston 122 carries the jaws 110 and 112 and the jaw actuating mechanism, in this case another double acting pneumatic actuator. The piston 122 is hollow throughout its length to receive a piston 142 of the second pneumatic actuator, and one end 122A is further relieved to accept a region 144 of increased cross-sectional dimension of the piston 142. As with the Z-axis pneumatic actuator, sealing structures 146, 148 and 150 seal the jaw pneumatic actuator. O-rings 152, 154, 156, 158 also aid in this sealing function. To operate the second actuator, pressurized air is admitted either through the air line 160 or the air line 162 to force the second actuator piston either down or up, by exerting pressure on one side or the other of the annular region 144. Of course, as is well known to those skilled in the art, means are provided for releasing the pressure on the other line which is not pressurized.

The second actuator piston 142 opens and closes the jaws 110 and 112. As shown in FIG. 8, the respective jaw members 110 and 112 each comprise in cross-section, a generally L-shaped member. Jaw member 110 is mounted for pivoting movement about pivot pin 164, whose ends are secured in the housing 170 (FIG. 6). Jaw member 112 is mounted for pivoting movement about pivot pin 166, whose ends are also secured in the housing 170. Extreme ends of the jaw members have dogs 172 and 174 extending therefrom.

A coupling fixture 176 is secured to the end of the second actuator piston 142, and moves upwardly and downwardly with the piston. The fixture 176 has opposed dogs 178 and 180 formed at opposite sides thereof. Respective chain links 182 and 184 are pivotally attached to respective dogs of the coupling fixture and the jaw members, via pins 186, 188, 190 and 192. The links 182 and 184 provide a means of transmitting pivoting force to the dogs 172 and 174 to open or close the tips of the jaws 110 and 112.

Figure 9:
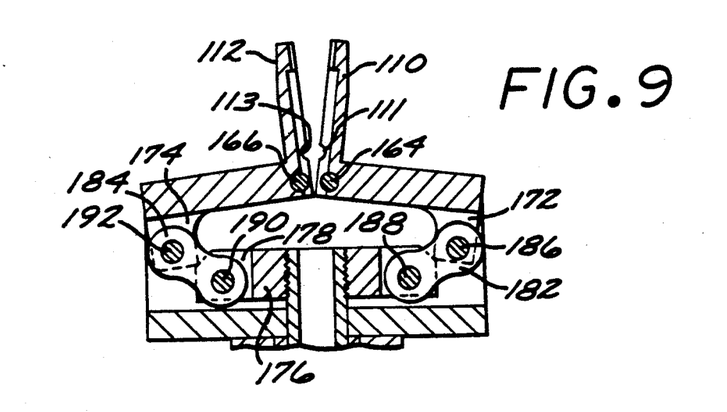
Figure 10:
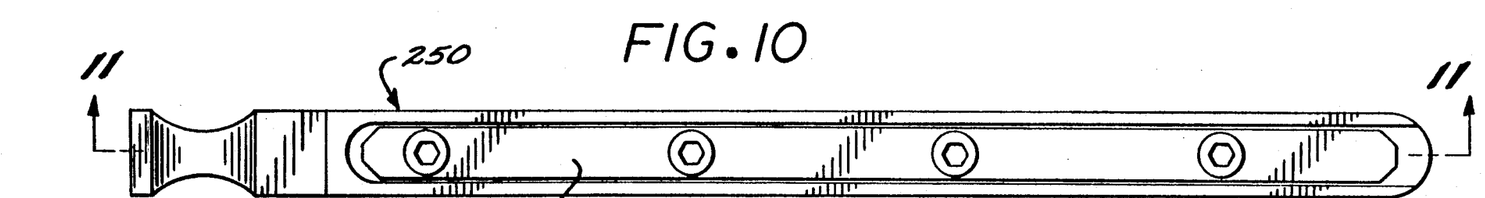
FIGS. 10-14 illustrate a tool clip as used in the tool changer system.
Figure 11:
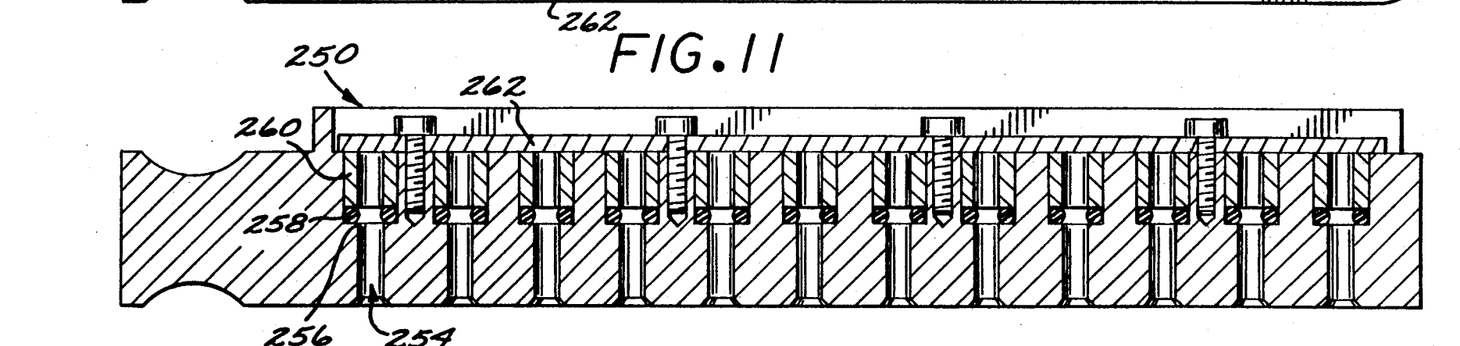
Figure 12:
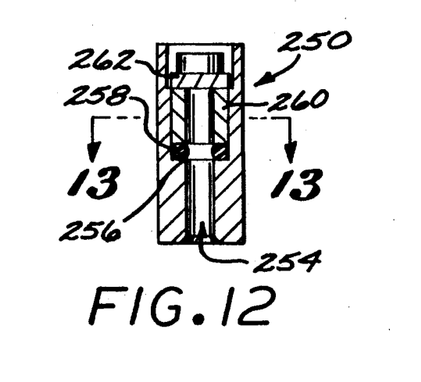
Figure 13:
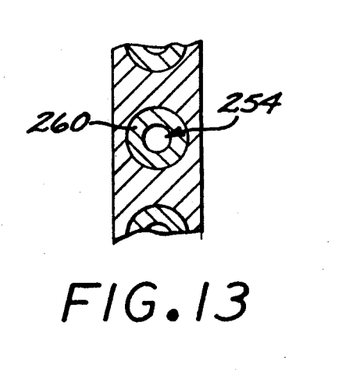

The Z-axis and jaw pneumatic actuators can be operated independently. FIG. 9 shows the jaws in the fully opened position, while the jaws are shown in the closed position in FIG. 8.

In accordance with the invention, the system 50 further comprises means for modulating the gripping pressure exerted by the grip jaws. Thus, the air pressure applied to line 160 can be either a relatively high pressure to securely grip the tool, or a relatively low pressure to grip the tool with a relatively low grip pressure. The low pressure is sufficient to hold the tool in place within the grip jaws against the force of gravity, but readily allows slippage when the tool is held by a spindle chuck during the tool insertion sequence described below.

The gripper apparatus 100 further includes an optical sensor for sensing the presence of the end of the tool at a reference with respect to the jaw tips. As shown in FIG. 9, the jaws 110 and 112 are formed with respective semicircular indentations 111 and 113 at the reference line point close to the pivot points. The optical sensor is similar to the sensors 236 and 238, and comprises a light source 114 which generates a light beam through the opening defined by the indentations 111 and 113 toward a photosensitive detector 116 on the other side of the jaws. The optical detector 116 generates a signal indicative of the interruption of the light beam once the tool has been inserted in the jaws to the extent of reference line 117.

Figure 14:
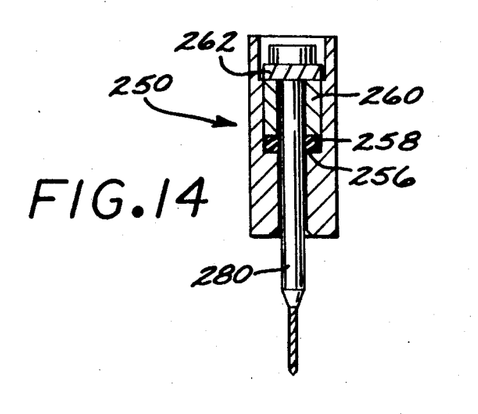

FIGS. 10-14 illustrates an exemplary clip 250 in further detail. Each clip 250 includes a plurality of aligned openings 254 into which the shank ends of the tools 280 are fitted (FIG. 14). The shank receiving end of the openings 254 are funnel-shaped, while the opposite ends are counter-bored with an enlarged diameter to define a shoulder 254 which provides a stop surface for an O-ring 258. A cylindrical insert 260 is fitted into the counterbore to secure the O-ring 258 in place. A cap plate 262 is fitted over the counter-bored ends of the openings 254 to provide a stop surface for the shank ends of the tools 280 (FIG. 14). The O-rings 256 are made of a resilient material such as neoprene, and have a slightly smaller inner opening diameter than the smaller diameter of the opening 254 to frictionally engage the shank of the tool 280. This frictional engagement holds the tool 280 in the clip 250 until removed by the gripper apparatus 100.

Figure 15:
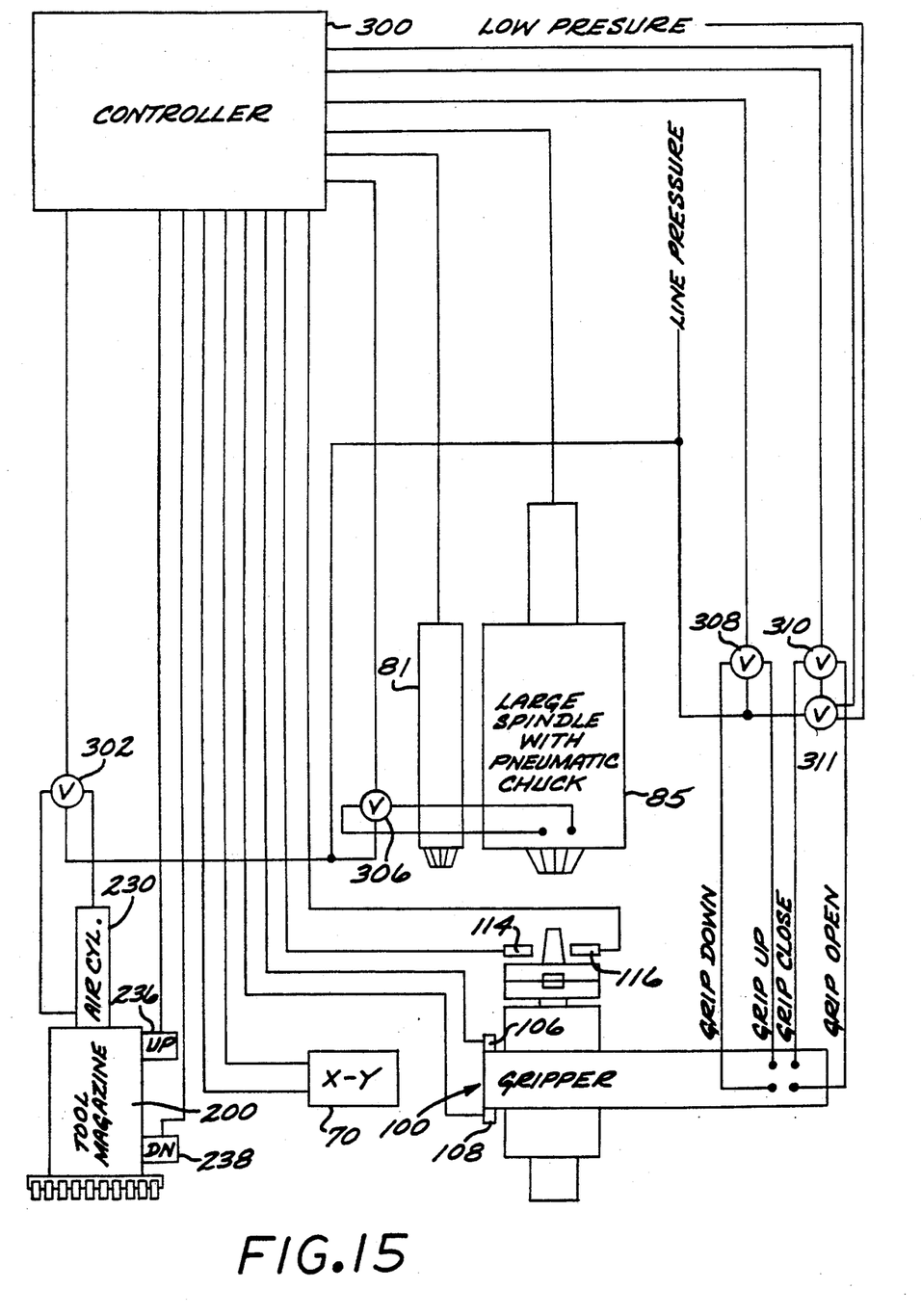
FIG. 15 is a simplified block diagram illustrating the controller and its general connection with elements of the tool changer system.
Figure 16:
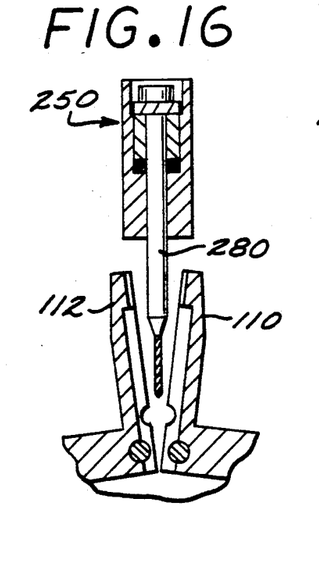
FIGS. 16-24 illustrate the sequence by which tools are transferred from the tool magazine clip to the drilling spindle in accordance with the invention.

FIG. 15 is a simplified block diagram of the control elements of the tool changer system for an exemplary spindle pair 81, 85. The controller 300 comprises a digital computer programmed to carry out the various functions needed to carry out the tool changing functions. Typically the controller functions will be integrated with the system controller for the drilling system such as the system control unit 505 described in U.S. Pat. No. 4,761,876. The controller 300 controls the air cylinder 230 through the control valve 302 to raise or lower the magazine 200. Another control valve 306 is controlled by the controller 300 to open and close the pneumatically operated chuck of drilling spindle 85. Other valves 308 and 310 are controlled by the controller 300 to operate the pneumatic actuators of the gripper apparatus 100 to raise or lower the apparatus and to open or close the grip jaws. Valve 311 controls the pressure supplied to the gripper jaws via valve 310, to provide line pressure or low pressure air. Control signals are generated by the controller 300 to raise or lower the electrically operated spindles 81 and 85 and to appropriately position the X-Y table 70.

The controller 300 receives sensor signals from the tool magazine up and down sensors 236 and 238, and from the sensors associated with the gripper apparatus 100. These sensors include the up and down location sensors 106 and 108, and the tool shank position sensor comprising the light source 114 and detector 116. The controller 300 also receives spindle Z-axis position information from the spindles 81 and 85, in the same manner as described in U.S. Pat. No. 4,761,876.

The tool changer system may be operated to insert a tool in the chuck of the particular drilling spindle, or to remove a tool from the spindle. When inserting a tool into the spindle chuck, the optical sensor comprising elements 114 and 116 may be employed in an insertion sequence to position the tool shank in the chuck so that the tool drilling end extends from the chuck a predetermined distance. The insertion and change tool sequences are outlined below. In these sequence, it will be understood that the magazine 200 is normally in the up position, the gripper 100 is normally in the down position with the grip jaws open, and the spindle are normally in the up position.

LARGE SPINDLES (85-88)

A. Insert Tool Sequence

1. Move the gripper 100 over under the selected tool in magazine.
2. Bring magazine down (to the tool change position), and move the gripper up.
3. Close the gripper jaws to grab the drill with the high gripping pressure.
4. Bring the magazine up and move the gripper down.
5. Move the X-Y table to position the gripper under the spindle.
6. Open the spindle chuck.
7. Raise the gripper to insert drill into the spindle chuck.
8. Close the chuck.
9. Reduce the gripper pressure to about 2 lb. holding force.
10. Lower the spindle until the optical sensor (114, 116) is triggered.
11. Increase the grip pressure.
12. Open the chuck.
13. Move the spindle down until the chuck contacts the gripper jaws.
14. Close the chuck.
15. Open the gripper.
16. Move the spindle up and the gripper down.
17. Ready to drill.

B. Change Tool Sequence

1. Move the gripper under the spindle.
2. Raise the gripper.
3. Close the gripper jaws to grab the drill.
4. Open the chuck.
5. Move the gripper down.
6. Move the gripper over under the selected clip opening in the magazine.
7. Lower the magazine and move the gripper up to insert the drill into the clip opening.
8. Raise the magazine and lower the gripper.
9. Repeat the "Insert Tool Sequence" until finishing the drilling sequence.

SMALL SPINDLES (81-84)

A. Insert Tool Sequence

1. Move the gripper under the selected tool held in the magazine.
2. Lower the magazine to the tool change position.
3. Close the gripper to grab the drill.
4. Raise the magazine and move the gripper down.
5. Move the gripper under the spindle.
6. Raise the gripper to insert the drill into spindle.
7. Reduce the gripper pressure to about 1 lb. holding force.
8. Lower the spindle until the optic sensor is triggered.
9. Close the gripper.
10. Lower the spindle until the spindle contacts the gripper jaw tips.
11. Open the gripper.
12. Move the spindle up and the gripper down.

B. Change Tool Sequence

1. Move the gripper under the spindle.
2. Raise the gripper.
3. Close the gripper jaws to grab the drill.
4. Lower the gripper.
5. Move the gripper under the selected clip opening in the magazine.
6. Lower the magazine and raise the gripper to insert the drill into magazine.
7. Open the gripper.
8. Raise the magazine and lower the gripper.
9. Repeat "Insert Tool Sequence."

Figures 17, 18:
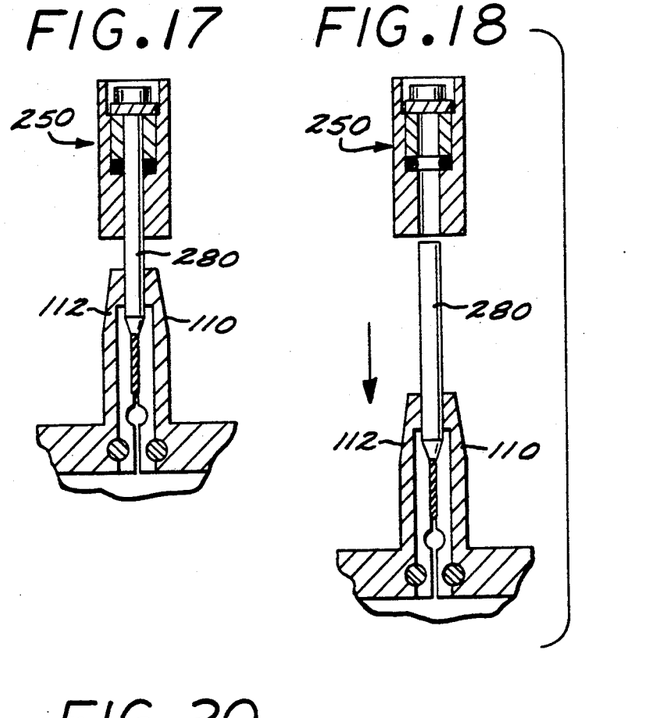

The insertion sequence for inserting the tool with a predetermined length extending from the spindle chuck is shown in FIGS. 16-27. Thus, the gripper jaws are open (FIG. 16) as the gripper apparatus is raised and the magazine lowered, and the tool 280 is gripped "short" (FIG. 17) by the jaws 110, 112, i.e., the jaws are not brought up against the clip structure, but grip the tool with a length of the shank between the tip of the jaws and the bottom of the clip structure. The gripper apparatus is lowered and the magazine raised to remove the tool from the clip (FIG. 18).

Figure 19:
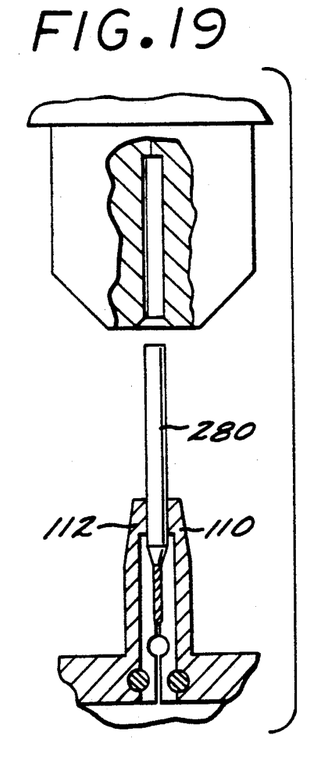
Figure 20:
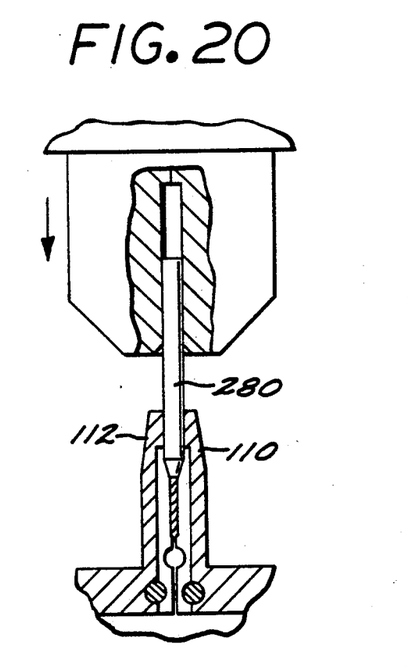
Figures 21, 22:
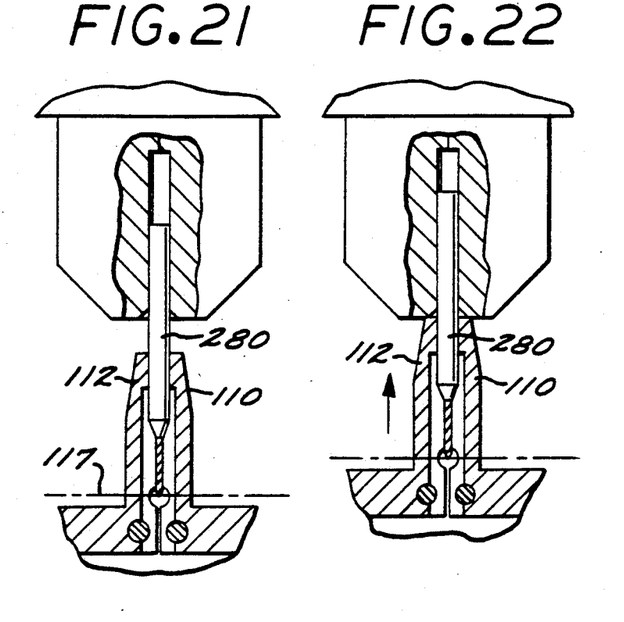

The gripper apparatus 100 carrying the tool 280 is then positioned under the spindle chuck with the chuck jaws open in the case of the pneumatic chuck (FIG. 19). The gripper apparatus is then raised (FIG. 20) to insert the tool shank into the chuck jaws. The chuck jaws are then closed on the tool shank (FIG. 21).

Figure 23:
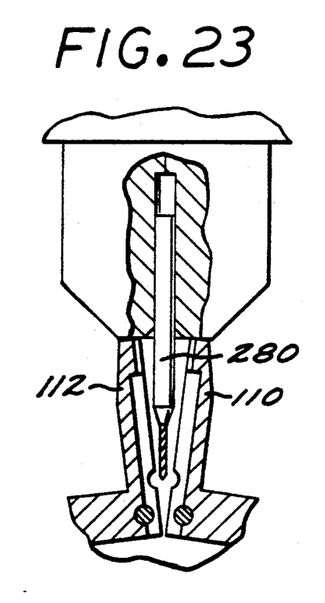

The following sequence results in the proper extension of the tool from the chuck. The air pressure applied to the pneumatic actuator closing the gripper jaws 110, 112 is substantially reduced to provide only a small grip pressure on the tool shank, e.g., two pounds holding force. The spindle is then lowered with the tool shank firmly gripped in the chuck, so that the shank in the gripper jaws 110, 112, slides, until the end of the tool triggers the optical sensor (114, 116) at phantom line 117 (FIG. 22). Full grip pressure is then applied to the gripper jaws, the jaws of the spindle chuck are released, and the spindle lowered further until about 0.040 inches in separation between the chuck and tips of the jaws 110, 112. At this point, the length of the tool extending from the chuck has been registered, and the gripper jaws are opened (FIG. 23).

Figure 24:
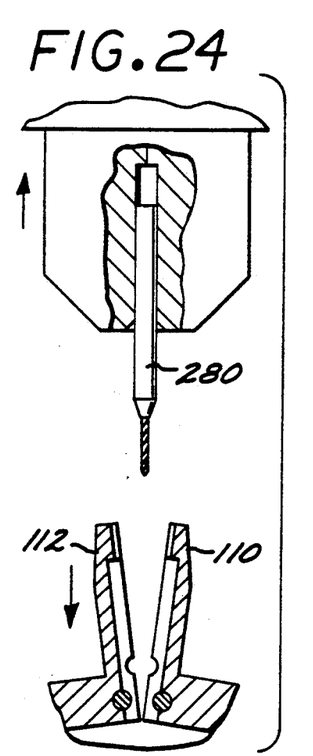

At FIG. 24 the spindle is raised and the gripper apparatus lowered. The insertion sequence is now completed.

Figure 25:
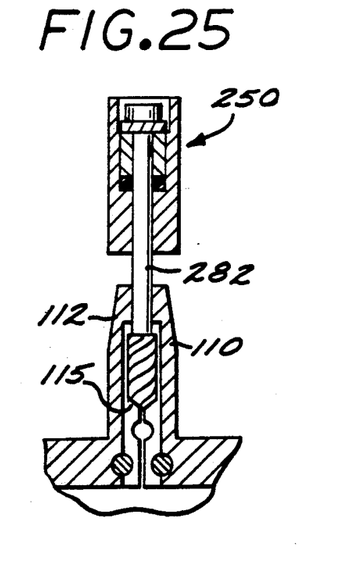
FIG. 25 illustrates the capability of the tool changer to handle over-sized tools.

A further feature of the gripper apparatus 100 is illustrated in FIG. 25. As shown therein, the gripper jaws 110 and 112 are formed with a relieved area below the tips of the jaws to form an opening 115 between the jaws when in the closed position. The opening allows the jaws to be used to grip tightly the shank of a tool 282 having an oversized bit end, i.e., a tool wherein the diameter of the drill operating end is larger than the shank end.

It is understood that the above-described embodiments are merely illustrative of the possible specific embodiments which may represent principles of the present invention. Other arrangements may readily be devised in accordance with these principles by those skilled in the art without departing from the scope of the invention.

What is claimed is:

1. A method of inserting a first end of an elongated tool of unknown length into a working unit so that a predetermined length of the tool extends from the unit, comprising a sequence of the following steps:
   (i) gripping the tool in a gripper device with a relatively high gripping pressure so that the first end of the tool extends from the gripper device, with a length of the tool received within the gripper device which is less than the predetermined length;
   (ii) aligning the gripper device with the working unit;
   (iii) effecting relative movement between the gripper device and the working unit to insert the first end of the tool into the working unit;
   (iv) gripping the tool by the working unit and reducing the gripping pressure of the gripper device on the tool so that further relative movement of the gripper and the working unit causes sliding movement of the tool in the gripper device;
   (v) effecting further relative movement between the gripper device and the working unit to reduce the distance therebetween while causing the tool to slide further within the gripper device until the length of the tool received within the gripper device is substantially equal to said predetermined length;
   (vi) releasing the tool gripping by the working unit and increasing the gripping pressure of the gripper device; and
   (vii) effecting further relative movement between the gripper device and the working unit to bring the gripper device and the working unit substantially adjacent each other to insert said tool into said working unit with said predetermined length extending from the working unit.

2. The method of claim 1 further comprising the step (viii) of releasing said tool by said gripper device and withdrawing the gripper device to allow the working unit to perform a work task with the inserted tool.

3. The method of claim 1 wherein the gripper device is movable toward the working unit between a first position away from the working unit and a second position toward the working unit, and the step (iii) of effecting relative movement to insert the tool into the working unit comprises moving the gripper device from the first position to the second position.

4. The method of claim 3 wherein the working unit is movable toward and away from the gripper device, and said step (v) comprises moving the working unit toward the gripper device until the tool is inserted into the gripper device said predetermined distance.

5. The method of claim 4 wherein said step (vii) comprises moving the working unit further toward the gripper device until substantially adjacent one another.

6. The method of claim 1 further characterized in that the working unit comprises a drilling spindle and the tool comprises a drilling tool.

7. The method of claim 1 wherein said gripper device comprises at least two gripper jaws which may selectively grip said tool with either a relatively high gripping force or a relatively low gripping force.

8. The method of claim wherein said step (v) comprises sensing the presence of the tip of said tool at a point spaced from the tip of the gripper device by a distance equal to said predetermined distance, and stopping said relative movement when the tip is sensed at this point.

9. Apparatus for inserting a first end of an elongated tool of unknown length into a working unit so that a predetermined length of the tool extends from the unit, comprising:
   a gripper device for receiving a second end of the tool and selectively gripping the tool with a relatively high gripping force or a relatively low gripping force;
   means for inserting the second end of the tool in said gripper device so that the first end of the tool extends from the gripper device, with a length of the tool received within the gripper device which is less than the predetermined length;
   means for aligning the gripper device with the working unit;
   means for effecting relative movement between the gripper device and the working unit to insert the first end of the tool into the working unit with said tool being gripped by said relatively high gripping force of said gripper device;
   means for gripping the tool by the working unit and reducing the gripping pressure of the gripper device so that further relative movement of the gripper and the working unit causes sliding movement of the tool in the gripper device;
   means for effecting further relative movement between the gripper device and the working unit to reduce the distance therebetween to cause the tool to slide within the gripper device until said length of the tool received within the gripper device is substantially equal to said predetermined length;
   means of releasing the tool gripping of the tool by the working unit and increasing the gripping pressure of the gripper device; and
   means for effecting further relative movement between the gripper device and the working unit to bring the gripper device and the working unit substantially adjacent each other to insert said tool into said working unit with said predetermined length extending from the working unit.

10. The apparatus of claim 9 further comprising means for releasing said tool by said gripper device and effecting relative movement between the gripper device and the working unit after the tool has been inserted into the working unit with a predetermined length extending therefrom, to allow the working unit to perform a work task with the inserted tool.

11. The apparatus of claim 9 further comprising means for moving the gripper device between a first position away from the working unit and a second position toward the working unit to insert the tool into the working unit.

12. The apparatus of claim further comprising means for moving the working unit toward the gripper device to insert the tool into the gripper device said predetermined distance.

13. The apparatus of claim 12 further comprising means for moving the working unit further toward the gripper device until substantially adjacent one another.

14. The apparatus of claim 9 further characterized in that the working unit comprises a drilling spindle and the tool comprises a drilling tool.

15. The apparatus of claim 9 wherein said gripper device comprises at least two gripper jaws which may selectively grip said tool with either a relatively high gripping force or a relatively low gripping force.

16. An improved gripper apparatus for an automated tool changer system, comprising:
a plurality of grip jaws each characterized by a jaw tip;
means for closing said jaws to exert gripping force on a tool inserted therebetween, said closing means comprising means for selectively applying a relatively high gripping force and a relatively low gripping force;
means for translating said gripper jaws along a predetermined axis between a first position and a second position; and
sensor means for sensing the condition that a tool has been inserted into the grip of the jaws a predetermined distance from the jaw tips.

17. The apparatus of claim 16 wherein said grip jaws each further comprise a jaw member arranged to pivot about a pivot point, said jaw tip defined at one end of the jaw member, the jaw member further characterized by a second end disposed on the other side of said pivot point from the jaw tip, and said means for closing said jaws comprises means for exerting a force on said second ends of said respective jaw members to cause said jaw members to pivot about said pivot point and urge the jaw tips toward one another.

18. The gripper apparatus of claim 17 further comprising means for opening said jaws, said opening means comprising means for exerting a force on said second ends of said respective jaw members to cause said jaw members to pivot about said pivot point and urge the jaw tips toward one another.

19. The apparatus of claim 18 wherein said opening means and said closing means further comprises a pneumatic actuator coupled to said second ends for exerting pulling or pushing forces on said second ends of said jaw members.

20. The apparatus of claim 19 wherein pneumatic actuator is actuated by application of fluid under pressure, and said means for exerting a selective gripping force comprises means for modulating the fluid pressure applied to said actuator to exert said force on said second ends of said jaws.

21. The apparatus of claim 19 wherein first pneumatic actuator is characterized by a first cylinder and a first piston, and said means for translating said gripper jaws comprises a second pneumatic actuator characterized by a second cylinder and a piston member, said second actuator comprising means for translating said second piston member along an actuator axis, and wherein said first pneumatic actuator and said gripper jaws are carried by said second piston member of said second actuator.

22. The apparatus of claim 21 wherein said piston of said second actuator is hollow and receives said first piston for sliding movement therein, and wherein said second piston further comprises means for defining said first cylinder of said first actuator at one end thereof.

23. The apparatus of claim 22 wherein said first piston further comprises means for defining a region of increased diameter thereof which is fitted within a first chamber of said first cylinder, and said first actuator further comprises means for pressurizing said chamber on either a first side or a second side of said region of increased diameter to thereby urge said piston to move in one direction or the other along its axis.

24. The apparatus of claim 23 wherein said second piston further comprises means for defining a second region of increased diameter which is fitted within a second chamber of said second cylinder, and said second actuator further comprises means for pressurizing said second chamber of said second actuator on either a first side or a second side of said second region of increased diameter to thereby urge said second piston to move in one direction or the other along its axis.

25. A tool changer system for a machine tool characterized by at least one spindle driving a replaceable tool having a shank and a tool end, a workpiece carrier mounted for movement in a plane, the spindle being translatable to effect movement of the tool relative to the workpiece carrier, the system comprising:
a tool magazine for releasably holding a plurality of said tools, said magazine comprising means for effecting translating movement of said magazine relative to the workpiece carrier;
a gripper apparatus secured to said workpiece carrier and comprising gripper means for receiving said tools in an inserted position within a tool gripper and selectively gripping said tools with a selectable grip pressure of either a relatively high grip pressure or a relatively low grip pressure to transfer tools between said spindle and said magazine, and means for effecting translating movement of said gripper means relative to said workpiece carrier;
means for sensing when the tool has been inserted to a predetermined depth in said tool gripper and generating an insertion depth signal indicative of such condition;
controller means for inserting the tool into the spindle so that a predetermined length of tool extends from the spindle, comprising means for aligning the gripper apparatus with a selected one of the tools in the magazine, and causing translation between the gripper and the magazine to insert the tool into the gripper means so that the length of tool inserted into the gripper means is less than said predetermined length, gripping the tool with the relatively high gripping pressure, thereafter aligning the gripper apparatus with the spindle, translating the gripper means in relation to the workpiece carrier to insert a portion of the exposed tool into the spindle, causing the spindle to securely grip the inserted portion of the tool, reducing the grip pressure of the gripper device, translating the spindle relative to the gripper device to insert more of the tool into the gripper until the insertion depth signal is generated, increasing the gripper device grip pressure and releasing the tool grip by the spindle; and translating the spindle toward the gripper device until the spindle is directly adjacent the gripper device so that said predetermined length of tool extends from the spindle; and releasing the gripping pressure of the gripper apparatus and causing the spindle to grip the tool in its inserted position.

* * * * *